US005636174A

United States Patent [19]

Rao

[11] Patent Number: 5,636,174

[45] Date of Patent: Jun. 3, 1997

[54] FAST CYCLE TIME-LOW LATENCY DYNAMIC RANDOM ACCESS MEMORIES AND SYSTEMS AND METHODS USING THE SAME

[75] Inventor: G. R. Mohan Rao, Dallas, Tex.

[73] Assignee: Cirrus Logic, Inc., Fremont, Calif.

[21] Appl. No.: 584,565

[22] Filed: Jan. 11, 1996

[51] Int. Cl.⁶ .................. G11C 7/00; G11C 7/02; G11C 8/00
[52] U.S. Cl. .................. 365/230.03; 365/230.06; 365/203; 365/207
[58] Field of Search .................. 365/203, 207, 365/230.03, 230.06

[56] References Cited

U.S. PATENT DOCUMENTS

| | | | |
|---|---|---|---|
| 5,214,610 | 5/1993 | Houston | 365/203 |
| 5,319,755 | 6/1994 | Farmwald et al. | 395/325 |
| 5,323,350 | 6/1994 | McLaury | 365/207 |
| 5,408,129 | 4/1995 | Farmwald et al. | 257/692 |
| 5,430,676 | 7/1995 | Ware et al. | 365/189.02 |
| 5,434,817 | 7/1995 | Ware et al. | 365/189.01 |
| 5,493,535 | 2/1996 | Cho | 365/203.03 |
| 5,495,444 | 2/1996 | Okubo et al. | 365/230.03 |
| 5,528,552 | 6/1996 | Kamisaki | 365/230.03 |

*Primary Examiner*—David C. Nelms
*Assistant Examiner*—Trong Quang Phan
*Attorney, Agent, or Firm*—Winstead Sechrest & Minick

[57] ABSTRACT

A memory 200 comprising a plurality of rows and columns of memory cells, each column of cells associated with a conductive bitline 301. Memory 200 further includes precharge circuitry 204, 206 for precharging a selected one of the bitlines in response to a received control bit.

34 Claims, 10 Drawing Sheets

FAST CYCLE TIME-LOW LATENCY DYNAMIC RANDOM ACCESS MEMORIES AND SYSTEMS AND METHODS USING THE SAME

CROSS-REFERENCED TO RELATED PATENT APPLICATIONS

The following co-pending and co-assigned U.S. patent application Ser. No. 08/521,867, entitled LOW PIN COUNT - WIDE MEMORY DEVICES AND SYSTEMS AND METHODS USING THE SAME, Attorney Docket No. 2836-P036US, filed Aug. 31, 1995 contains related information and is incorporated herein by reference.

TECHNICAL FIELD OF THE INVENTION

The present invention relates in general to electronic memories and in particular to fast cycle time—low latency dynamic random access memories and systems and methods using the same.

BACKGROUND OF THE INVENTION

Presently, most semiconductor memory subsystems employed for data storage in computers are constructed from static random access memory devices (SRAMs) and dynamic random access memory devices (DRAMs). Each type of memory device has advantages and disadvantages, and as a result, DRAMs and SRAMs are typically employed in different applications. Specifically, SRAMs are faster and hence are normally used when fast access time and high bandwidth are critical, such as in cache memories. SRAMs however consume more power, are more expensive to fabricate, and provide fewer cells (bits) per given chip space. On the other hand, while slower than SRAMs, DRAMs are less expensive, consume substantially less power, and provide more bits in the same chip space (i.e. have a higher cell density). DRAMs are normally used to construct those memory subsystems, such as system memories and display frame buffers, where power conservation and high cell density are more critical than speed. In most computing systems, it is these subsystems which dominate the system architecture, and thus, DRAMs are the prevalent type of memory device on the market.

The speed restrictions on DRAMs are a direct consequence of the established manner in which conventional DRAMs are constructed and operated. In particular, the vast majority of DRAMs require two periods per row access (precharge and active), as timed by a row address strobe (/RAS) and a column address strobe (/CAS). These two periods together constitute one cycle. When/RAS is in a logic high state, the DRAM device is in a precharge cycle, during which the nodes of various dynamic circuits, such as those used in the column and row decoders, are pulled to a predetermined voltage. Most importantly, during the precharge cycle the bitlines of the cell array are voltage equalized, as will be discussed further below. Then, when/ RAS transitions to a logic low, the device enters the active cycle. Typically, the row address bits are presented to the address pins and latched into the DRAM device with the falling edge of /RAS. After a very small delay for set up, the column address bits are presented at the address pins and latched-in with/CAS. A short time thereafter the addressed cells (location) can be accessed. During page mode, additional column addresses are input with additional falling edges of/CAS (/CAS cycling) to access a series of "pages" along the selected row. At the end of the active cycle, /RAS returns to a logic high state and the device re-enters precharge. In any event, when a change in row is required, a complete new/RAS cycle, including a new precharge cycle and a new active cycle is required.

To improve device speed, it would be desirable to shorten the length of each precharge cycle. Currently, the typical precharge cycle is between 50–60 nsec in length (the typical active cycle is also approximately 50–60 nsec long). While the nodes of most of the dynamic circuitry, such as that used in the row and column decoders, can be charged or discharged within 10 nsecs, the full 50 to 60 nsecs is required to precharge and equalize the bitlines of the cell array. Improving speed of bitline precharge however is constrained by the physics of the CMOS circuitry used in the fabrication of the vast majority of DRAM devices and cell density (4 Mbit to 1 Gbit).

The typical DRAM cell array is arranged in rows and columns of cells, with each row controlled by a conductive wordline and each column of cells associated with a conductive bitline formed by a ("true") half-bitline and a "complementary" half-bitline. A sense amplifier is coupled between each half-bitline /complementary half-bitline pair. During a voltage-high precharge, all of the half-bitlines in the array are precharged to a predetermined voltage, for example 3.3 volts for a 3.3 V Vcc device, and then allowed to float (in some devices, precharge is to substantially zero volts but for purpose of the present discussion, precharge towards Vcc is assumed). During the active cycle, the wordline selected in response to the received row address is selected and all the cells along the corresponding row are turned on. During a read or refresh, the sense amplifiers detect the voltage swing between each precharged halfbitline pair and latch one half-bitline of the pair to a full logic high and the other to a full logic low, depending on the direction of the swing. During a write, the sense amplifiers pull down one half-bitline in each pair, depending on which of the true and complementary half-bitlines is to carry the logic zero and latch-high the other half-bitline. A write of a logic 1 is similar.

The voltage swings on the bitlines are extremely small, and therefore, to avoid mis-matching while sensing from a selected bit, the precharge voltage on each bitline pair must be equalized during precharge as closely as possible. Notwithstanding, some voltage imbalance will always exist, often on the order of 2 to 3 millivolts. Among other things, constraints on the chip fabrication processes result in variations in the lengths and widths of transistors, as well as the capacitance and resistance of the bitlines in the array. The voltage imbalance problem is compounded by inherent variations in the threshold voltages of the transistors used in the sense amplifiers. Therefore, in order to minimize the effect on the imbalances on sense amplifier operation, the bitlines are fully charged during equalization, normally as close to 3.3 volts as possible in a 3.3 volt device.

The full charging of the bitlines dictates the 50 to 60 nsec length of the precharge cycle. Assume for discussion that the capacitance of each bitline (half-bitline pair)is approximately 1 pf. For an array of 4,096 columns, the array capacitance is approximately 4096 pf. Since i=C(dV/dt), to charge the array to approximately 3.3 V in 50 nsecs requires a current of approximately 270 mA. This current can reasonably be provided on chip. However, to decrease the precharge time for the array to 25 nsecs or less, the current must at least double to 570 ma, a current which cannot be reasonably be provided on chip. Further, it should be noted that speed of charging the bitlines is also constrained by the fact that $V=V_o e^{-t/Rc}$, where $V_o$ is the initial voltage, t is the time to charge and R and C are the bitline resistance and capacitance respectively. In sum, the larger the array, the slower the charging for a given current.

As processors become faster, the need for faster memories becomes more critical. Short access time particularly becomes critical during operations, such as numerical calculations, where the CPU requires numerous random accesses from memory. Further, during operations such as display refresh/update, where substantial amounts of data are streamed from memory, short access times become important to insure that the cumulative time required for the operations are minimized. In each case, minimizing memory access time improves performance since system resources, such as the buses and core logic are freed for use on additional tasks.

Currently, in order to continue to take advantage of the power consumption and bit density advantages of DRAMs, various techniques have been developed at the system level in order to overcome DRAM speed deficiencies. These techniques are neither ideal nor directly address the problem of memory access speed at its root cause at the device level.

Cache memory is often used to improve access to data by the CPU. In this case, when data is required by the CPU from the system memory, entire blocks of data of a given spacial and/or temporal locality are retrieved from system memory and stored in a fast SRAM cache memory. Accesses by the CPU from cache can then be made with a shorter access time. Still, between 5 to 10 percent of the time, depending on the cache hit rate, the CPU still has to directly access the DRAMs of the system memory. In other systems, multiple memory banks and interleaved accesses are used to improve data access times. These systems normally require implementation of a more complicated timing scheme and often require the use of significantly more memory.

In sum, because of the difficulties of improving access time at the device level, most of the significant present efforts to overcome the speed disadvantages of DRAMs have been directed to improvements in memory operation at the system level. These solutions have their own disadvantages and the problem of long random access times in DRAMs has never been directly resolved. Thus, the need has arisen for a DRAM with a fast cycle time and low latency. Such a device would provide the power consumption and bit density advantages of conventional DRAMs yet provide for faster accesses, notwithstanding the use of caching and/or interleaving in the system.

SUMMARY OF THE INVENTION

According to a first embodiment of the present invention, a memory is provided which includes a plurality of rows and columns of memory cells, with each of the columns of cells associated with a conductive bitline. The memory also includes precharge circuitry for precharging a selected one of the bitlines in response to a received control bit.

According to another embodiment of the principles of the present invention, a memory is provided which includes an array of memory cells arranged in rows and columns, each of the columns associated with a bitline and each of the rows associated with a plurality of subwordlines, wherein each subwordline controls ones of the cells coupled to a corresponding group of the bitlines. The memory further includes precharged circuitry for precharging a selected one of the groups of bitlines and addressing circuitry for selecting a subwordline controlling the cells coupled to the selected group of bitlines.

According to a further embodiment of the principles of the present invention, a memory subsystem is disclosed which includes input/output circuitry for inputting and outputting data and addresses and at least one memory bank coupled to the input/output circuitry. The memory bank includes a plurality of rows and columns of memory cells, a cell of a column coupled to a bitline associated with a column and a cell of a row coupled to a selected one of a plurality of subwordlines associated with the row. The memory bank further includes precharge circuitry for precharging selected ones of the bitlines to a predetermined voltage and precharge decoder circuitry for selecting in response to received precharge selected bits selected ones of the bitlines for precharge by the precharge circuitry. Each memory bank includes a row decoder circuitry and column decoder circuitry. The row decoder circuitry activates a subwordline in response to a received row address to select a portion of a selected row for access. The column decoder circuitry selects for access in response to a received column address selected ones of the bitlines along the selected portion of the selected row.

The principles of the present invention are further embodied in a method of operating a memory which includes a plurality of memory cells arranged in rows and columns, the cells of a column coupled to a bitline associated with the column and each cell of a row coupled to a preselected one of a plurality of subwordlines associated with the row. The memory further includes precharge circuitry for precharging a selected group of bitlines in response to at least one precharge selected bit and addressing circuitry for activating a selected one of the subwordlines in response to an address. The method includes the step of providing at least one precharge select bit for precharging a selected group of bitlines during a precharge period. Further, during the precharge period, a row address is provided for selecting a subwordline for activation, the subwordline selected for activation controlling cells coupled to the group of bitlines selected for precharge. Additionally, during the precharge period, the selected group of bitlines are precharged. Finally, during an active cycle, at least some of the cells coupled to the activated subwordline are accessed.

Memories embodying the principles of the present invention, and systems and methods employing such memories, have substantial advantages over the prior art. Specifically, such memories substantially reduce the amount of time required for precharge by significantly reducing the amount of capacitance which must be charged. This in particular allows for the construction of a DRAM with a fast cycle time and low latency. Such a device provides power consumption and bit density advantages of conventional DRAM yet provides for the faster accesses normally only found with SRAMs. Advantageously, the principles of the present invention directly address the problems of long cycle time and low latency of conventional DRAMs rather than resorting to system level schemes such as caching and/or interleaving.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-10 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1A:
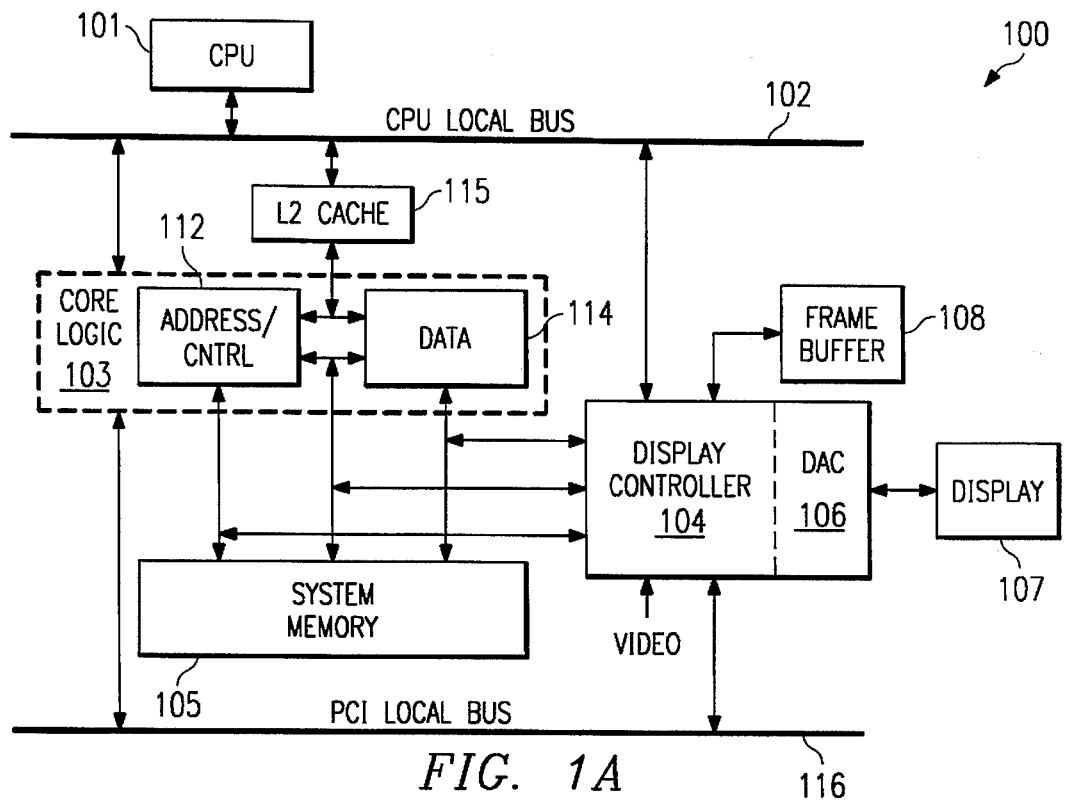
FIGS. 1A and 1B are high level functional block diagrams of exemplary data processing systems embodying the principles of the present invention.

FIG. 1A is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108, and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium class microprocessor or the like, used in commercial personal computers. CPU 101 communicates with the remainder of system 100 via CPU local bus 102, which may be for example a special bus, or a general bus (common in the industry).

Figure 1B:
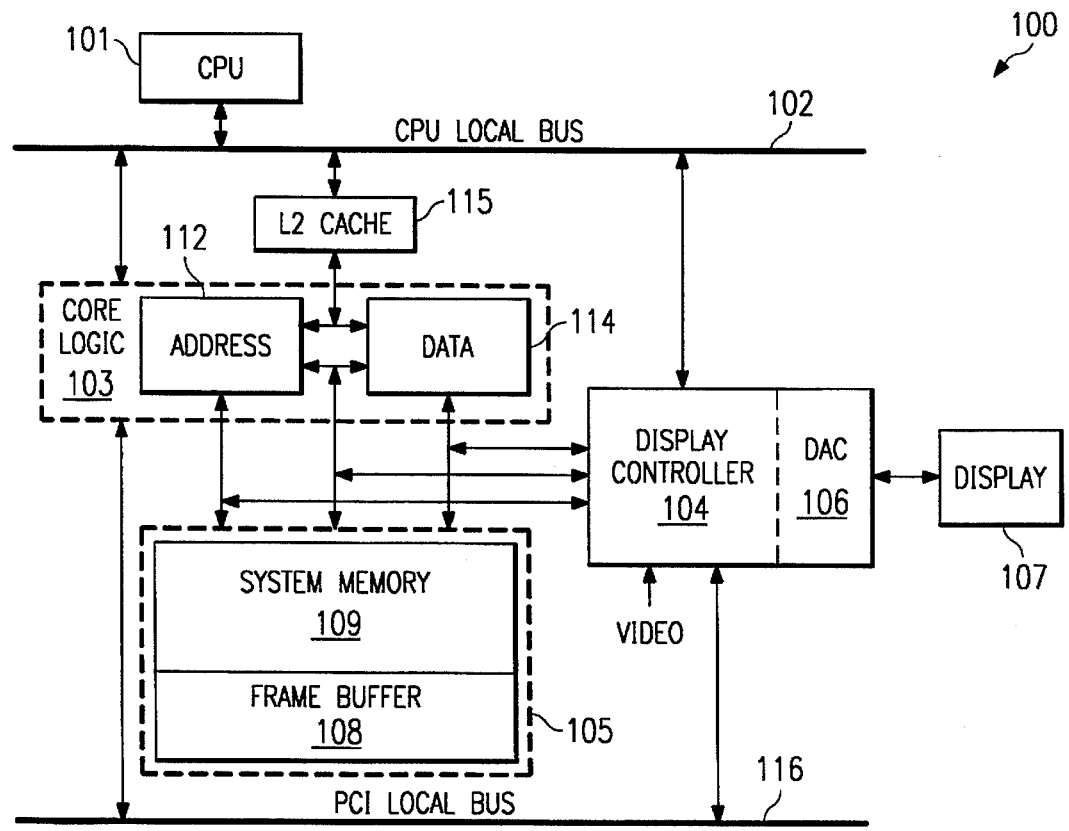

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1B, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256K Byte fast SRAM device(s). It should be noted that CPU 101 can also include on-board (L1) cache, typically up to 16 kilobytes.

In addition to the conventional functions described above, core logic 103 and/or CPU 101 provide the additional functions described below, either through software programming (such as in the core logic 103) or hardware modification.

Display controller 104 may be any one of a number of commercially available VGA display controllers. For example, display controller 104 may be one of the Cirrus Logic CL-GD754x series of display controllers. The structure and operation of such controllers is described in *CL-GD754x Application Book*, Rev 1.0, Nov. 22, 1994, and *CL-GD7542 LCD VGA Controller Preliminary Data Book*, Rev. 1.0.2, Jun. 1994, both available from Cirrus Logic, Inc., Fremont, Calif., and incorporated herein by reference. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus 116 which may be for example a PCI local bus. Generally, display controller 104 controls screen refresh, executes a limited number of graphics functions such as line draws, polygon fills, color space conversion, display data interpolation and zooming, and video streaming, and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip, preferably including a combination color palette RAM/ digital-to-analog converter circuit (RAMDAC) and phase locked loop (PLL). Depending on the specific implementation of system 100, DAC 106 may also include a color palette, YUV to RGB format conversion circuitry, and/or X-and Y-zooming circuitry, to name a few options. Displays 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations.

FIG. 1B is an alternate system architecture of system 100 to which the principles of the present invention may advantageously applied. In this example, memory 105 is a "unified" memory system since the system memory 109 and frame buffer 108 are collocated in a single integrated circuit or bank of integrated circuits. This is in contrast to those systems in which the frame buffer is separate and apart from the system memory and interfaces with the remainder of the system through the display controller. System memory 109 again is preferably a traditional system memory which stores data, addresses, and instructions under the command of CPU 101 as required for executing various processing functions and applications programs. As in traditional systems, the frame buffer 108 stores the pixel data required to generate the required images on the screen of display unit 107.

Figure 2:
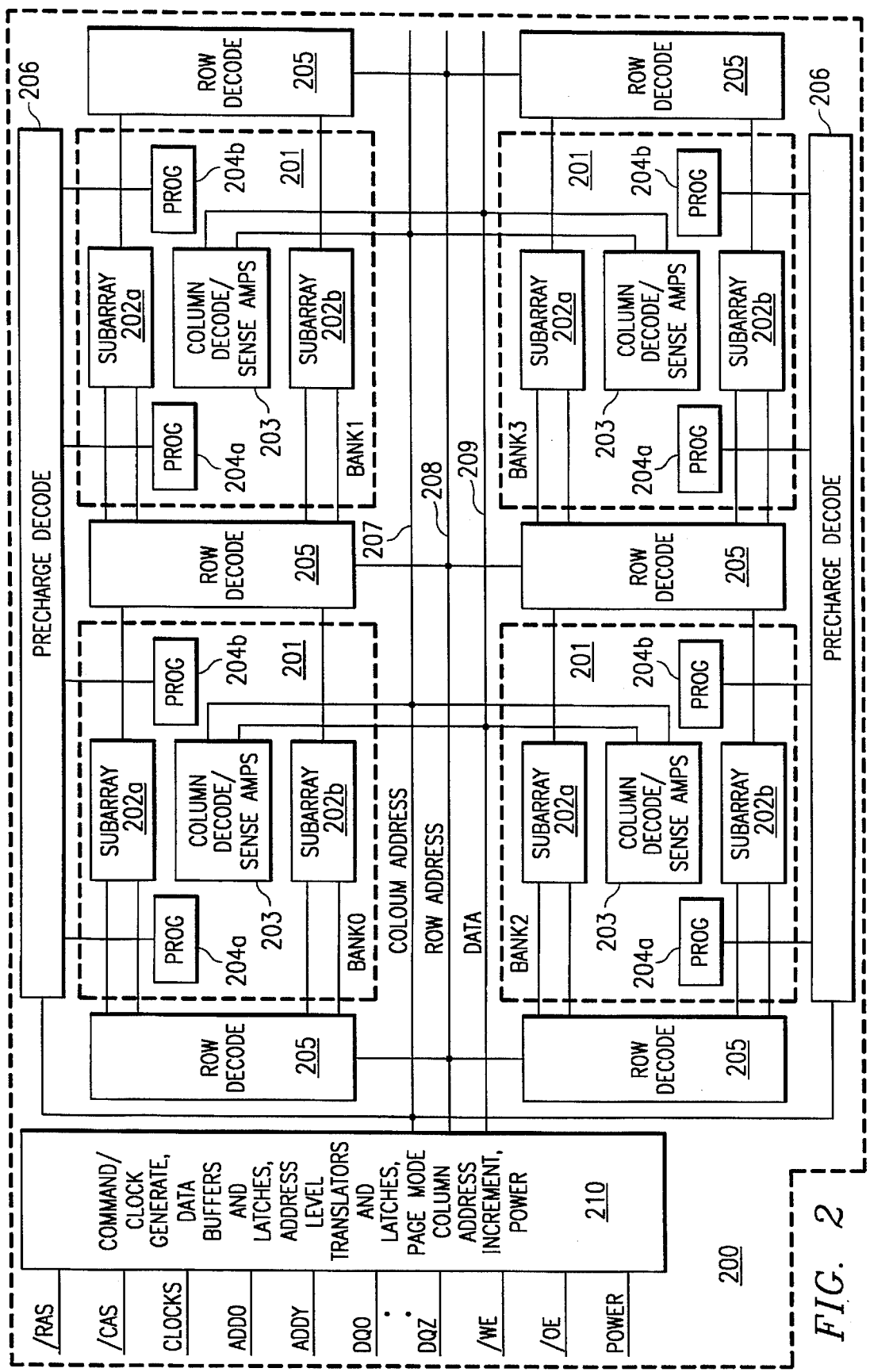
FIG. 2 is a more detailed block functional diagram of a first exemplary memory device according to the principles of the present invention.

FIG. 2 is a high level functional block diagram of a memory subsystem (device) 200 embodying the principles of the present invention. Memory 200 may be used for example in the construction of either system memory 105 and/or display frame buffer 108 in the system of FIG. 1A or the unified memory 105 of FIG. 1B, to name a few examples. In the preferred embodiment, memory subsystem 200 is fabricated as a single integrated device (chip), although the present inventive principals are not limited to such single chip embodiments.

In the preferred embodiment, memory subsystem 200 includes one or more memory banks 201. In FIG. 2, four such banks 201, labeled Banks 0–Bank 3, are shown for illustration purposes. In alternate embodiments, the exact number of banks will vary depending on such factors as available chip space, the address space of core logic 103 and the amount of data storage capacity required.

Figure 6A:
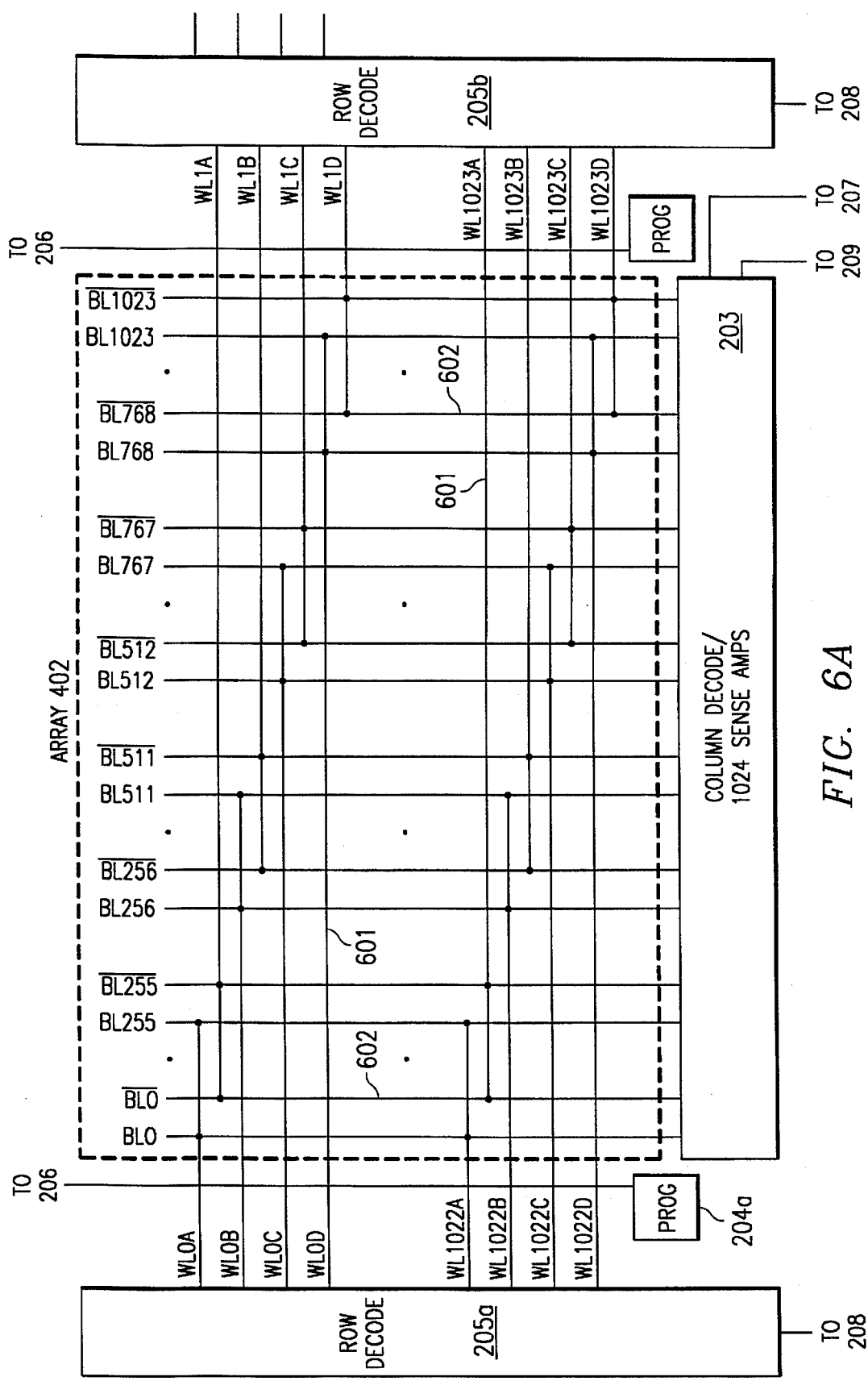
FIGS. 6A and 6B are detailed functional block diagrams depicting two possible organizations of the cell arrays depicted in FIG. 5.
Figure 6B:
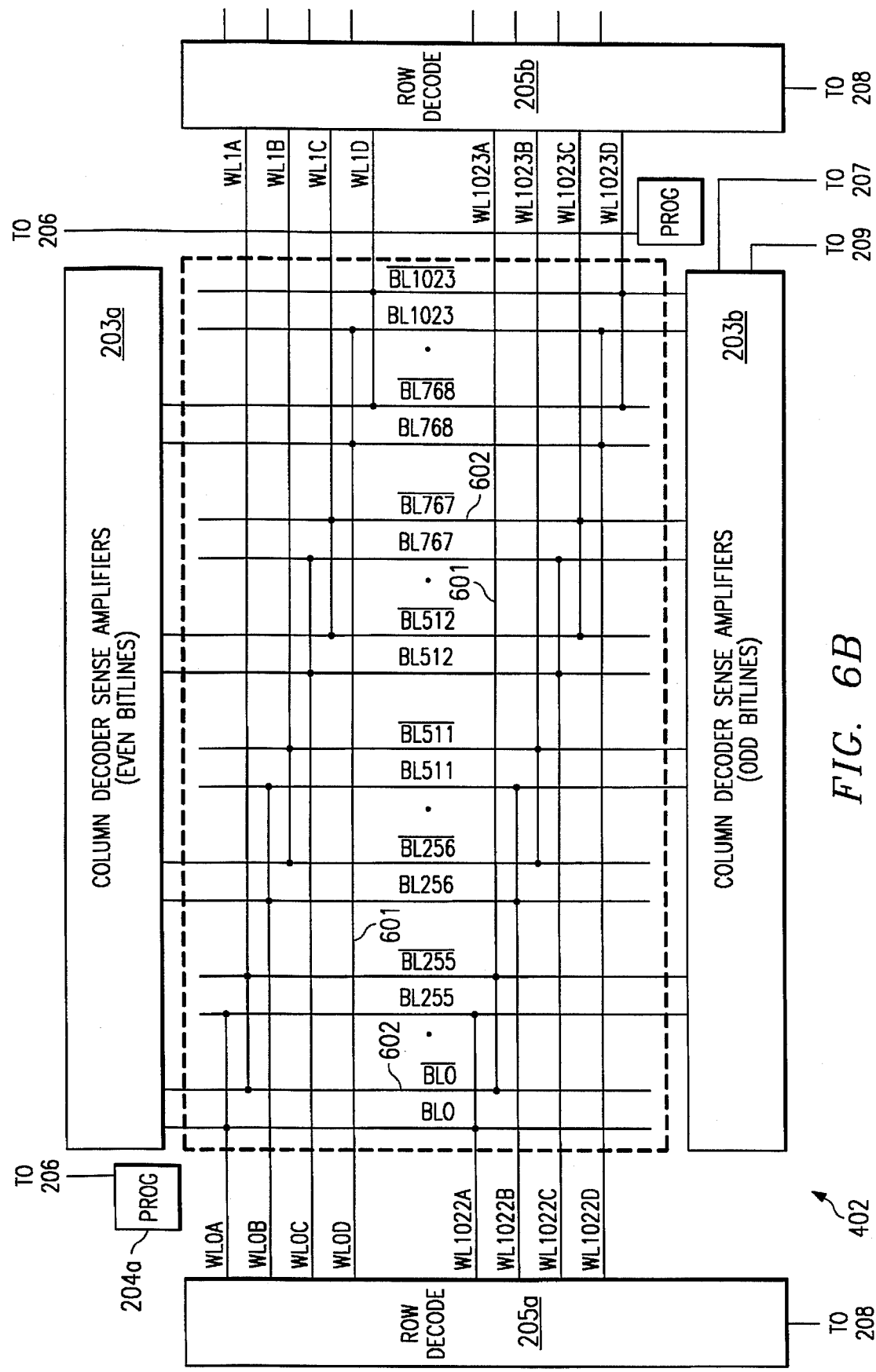

In memory system 200, each memory bank includes two subarrays 201A and 202B of dynamic random access memory (DRAM) cells arranged as M number of rows and N number of columns. The subarrays 202A and 202B of each bank 201 are associated with dedicated column decoder/sense amplifier circuitry 203. In memory subsystem 200, the subarrays 202A and 202B of each bank 201 are coupled to corresponding sense amplifiers in an open-bitline arrangement. For example, each subarray 202A may contain the "true" half-bitlines $BL_M$ and subarray 202B correspondingly would contain the complementary half-bitlines $\overline{BL}_M$ for the corresponding bank 201 A representative open bitline organization is depicted in the more detailed drawing of FIG. 3 and a folded bitline approach is shown in FIGS. 6a and 6B.

Each memory bank 201 further contains precharging circuitry 204. In the illustrated embodiment, the precharging circuitry 204 is partitioned into two circuit banks 204a and 204b. Preferably, precharge circuitry 204A is used to charge the selected half-bitlines from the proximate one-half of subarray 202A along with the corresponding complementary half-bitlines in subarray 202B while precharge circuitry 204B is used to selectively precharge the half-bitlines from the other half of subarray 202A and the corresponding half-bitlines in subarray 202B. A preferred interconnection of precharge circuitry 204 with the bitlines of subarrays 202 is discussed below in conjunction with FIG. 10.

The wordlines associated with the rows of cells in each subarray 202 are coupled to and controlled by row decoder circuitry 205. As will be discussed further below, according to the principles of the present invention, the wordlines of each subarray 202 are composed of a preselected number of subwordlines (fractional or partial wordlines). In the embodiment of FIG. 2, row decoder circuitry 205 is partitioned into a preselected number of circuit blocks, with the subwordlines of each subarray 202 controlled by a pair of row decoder circuit blocks 205. It should be further noted that the subarrays 202 of adjacent banks 201 in multiple bank embodiments such as subsystem 200, are controlled in part by common blocks of row decoder circuitry 205.

According to the principles of the present invention, memory subsystem 200 includes precharge decode circuitry 206 which controls the precharge circuitry 204 of each memory bank 201. The preferred structure and operation of precharge decoder circuitry 206 will be discussed in detail below, in particular with regards to FIG. 9. However, generally, precharge decode circuitry 206, in response to selected received column address bits, provides for precharge of only certain bitlines of the cell array (subarrays) a selected memory bank 201 during the/RAS precharge cycle. The remaining bitlines in that array, as well as all of the bitlines of the other non-selected banks 201, are allowed to float. Further, only the sense amplifiers coupled to these selected bitlines are turned on. In this fashion, the amount of capacitance that must be charged during the precharge cycle is substantially reduced and the number of sense amplifiers consuming power significantly reduced. As a result, for given available on-chip precharge current, the length of the/RAS precharge cycle is substantially reduced. Preferably, the/RAS precharge cycle could be reduced to as little as 10 nsec, with an appropriate choice of the number of bitlines to be precharged per/RAS cycle and the current made available on chip, in accordance with the relationship $i = C\, dv/dt$).

Column addresses are presented to precharge decode circuitry 206 and the column decoders 203 via column address bus (lines) 207. Row addresses are coupled to the blocks of row decoder circuitry 205 via a bus (lines) 208. Data is exchanged with an addressed location within the subarrays 202 of a selected bank 201 via a data bus 209 and the corresponding column decoder circuitry 203.

Data, address clocks, and control signals are exchanged with memory subsystem 200 through input/output and control circuitry 210. In system 100, these signals may be received from core logic 103 or display controller 104, depending on whether memory 200 is used as part of the system memory or the frame buffer and/or whether a unified memory architecture is being used. Circuitry 210 includes conventional clock generation circuitry for generating the clocks needed drive the dynamic circuitry of memory 200. Input/output circuitry 210 further includes conventional data buffers and latches, address level translators and address latches, page mode column incrementation circuitry and circuitry for controlling power distribution. Among the received clocks may be a master clock, if memory 200 is a synchronous DRAM.

Preferably, system 200 is designed for operation with a multiplexed address bus. The timing of the input of row and column addresses will be discussed in conjunction with FIG. 7. In the illustrated embodiment, subsystem 200 includes a Y-bit wide address port (lines ADD0-ADDY) and a Z-bit wide data port (DQ0-DQZ). Data reads and writes controlled by conventional write enable signal (WE) and a conventional output enable signal (/OE).

In the preferred embodiment, row decoders 202, sense amplifiers 203 and column decoders 204 are dynamic circuitry known in the art. Typical dynamic decoding and sensing circuitry are illustrated in "*A 5-volt Only 64k DRAM*", L. S. White, N. H. Hong, D. J. Redwine, and G. R. Mohan Rao, International Solid State Circuit Conference 1980, Digest of Technical Papers, pp. 230–231, incorporated herein by reference.

Some of the fundamental principles of DRAM construction and operation are additionally described in: "*A 64-k Dynamic RAM Needs Only One 5-volt Supply to Outstrip 16k Parts*", G. R. Mohan Rao and John Hewkin, Electronics, Sep. 28, 1978, pp. 109–116; "*A 1Mb DRAM With Design-For-Test Functions*," J. Neal, B. Holland, S. Inoue, W. K. Loh, H. McAdams and K. Poteet, International Solid State Circuit Conference 1986, Digest of Technical Papers, pp. 264–265; "*A 4 Mb DRAM With Half internal-Voltage Bitline Precharge*", International Solid State Circuit Conference 1986, Digest of Technical Papers, pp. 270–271; "*A Full Bit Prefetch Architecture For Synchronous DRAMs*", T. Sunaga, K. Hosokawa, Y. Nakamura, M. Ichinose, A Moriwaki, S. Kakimi and N. Kato, IEEE Journal of Solid State Circuits, Vol 30., No. 9, September 1995, pp. 994–1005; and "*DRAM Macros For ASIC Chips*", IEEE Journal of Solid State Circuits, Vol 30., No. 9, September 1995, pp. 1006–1014, each incorporated herein by reference.

Figure 3:
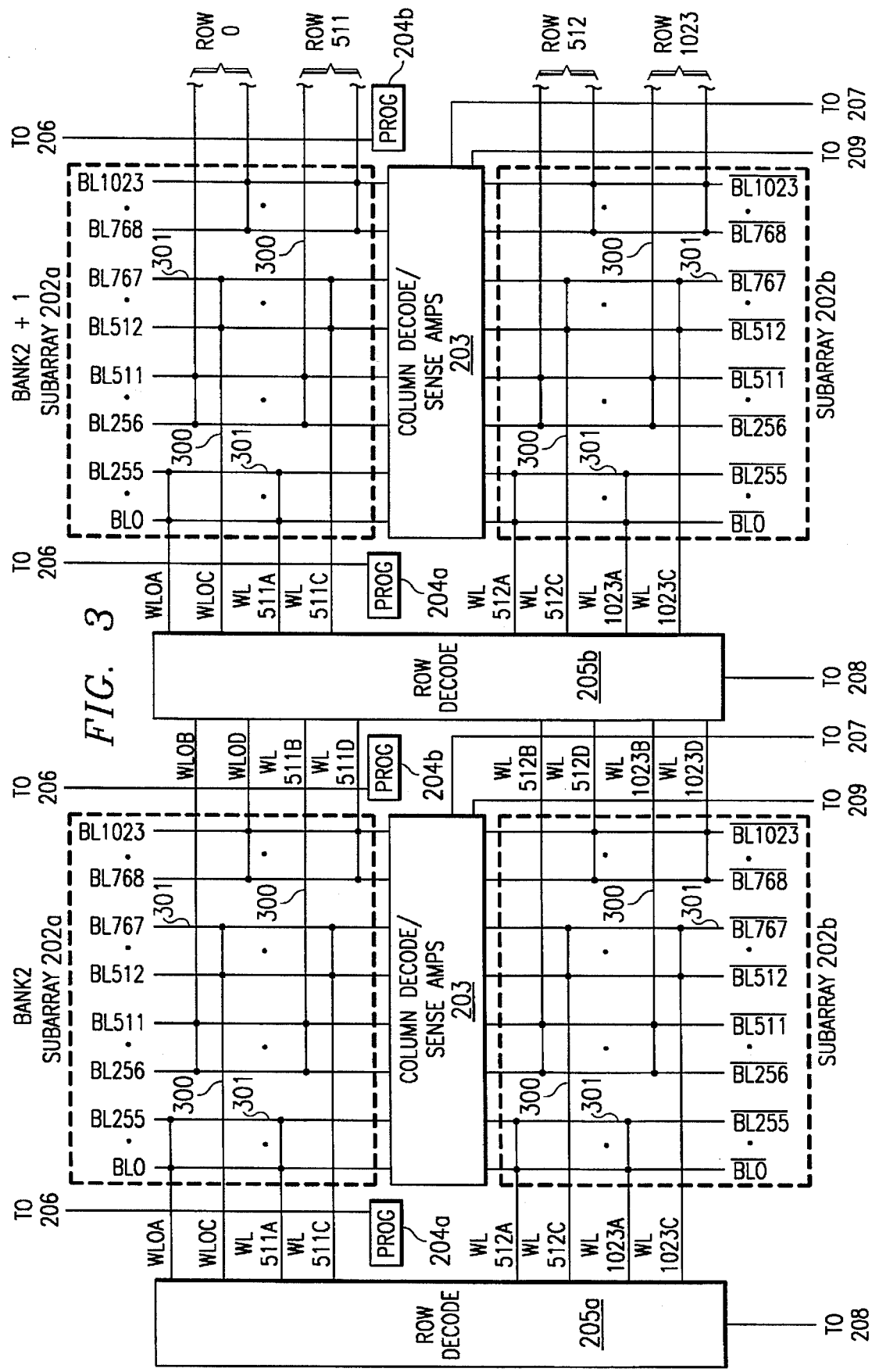
FIG. 3 is a detailed functional block diagram of selected ones of the cell arrays depicted in FIG. 2.

FIG. 3 is a more detailed functional block diagram depicting the row and column organization for a given pair subarrays 202 of memory subsystem 200 for a given pair of adjacent banks labeled BANK Z and BANK Z+1. Each subarray, includes M/2 number of rows and N number of columns. For purposes of discussion, it will be assumed that each bank 201 has a storage capacity of 1 Mbit and that each subarray 202(a or b) is organized as 512 rows (i.e. M=1024) and 1024 columns (i.e. N=1024).

According to the principles of the present invention, each row of cells is controlled by a plurality of subwordlines 300, each of which controls a group of DRAM cells of a selected number of intersecting half-bitlines 301. The number of cells controlled by each subwordline 300 will vary from embodiment to embodiment. Generally, S=N/B, where S is the number of subwordlines per row, N is the number of bitlines in the array (subarray) and B is the number of bitlines per group. In the present example, with 1024 columns in each subarray, 256 cells along 256 intersecting half-bitlines 301 are controlled by a corresponding one of four subwordlines 300. In the preferred embodiment, one sense amplifier is coupled between each bitline BLx/complementary bitline $\overline{BL}_x$ pair.

In the illustrated embodiment of FIG. 3, the four subwordlines 300 which control accesses to the memory cells of Row 0 are labeled WL0A, WL0B, WL0C, and WL0D respectively. Subwordline WL0A controls the cells for the first 256 intersecting bitlines BL0–BL255 along Row 0. The selection of subwordline WL0A is controlled by row decoder 205A. The DRAM cells at the intersections of Row 0 and half-bitlines BL256–BL511 are controlled by subwordline WL0B which is coupled to row decoder 205B. The cells for the next 256 bitlines along Row 0 (Bitlines BL512–BL267) are controlled by row decoder 205A and subwordline WL0C. Finally, in the subwordline WL0D controls the DRAM cells for Row 0 at the intersections with bitlines BL768–BL1023. Subwordline WL0D is controlled by row decoder 205B. This pattern repeats itself for the remaining rows in subarray 202a and continues with the complementary bitlines in subarray 202b (the last set of subwordlines in subarray 202a are labeled WL511A–WL511D and the first set of subwordlines in subarray 202b are labelled WL512A–WL512D). The last set of four subwordlines 300 control the last Row in subarray 202a (Row 1023) and are labelled WL1023A–WL1023D.

Figure 4:
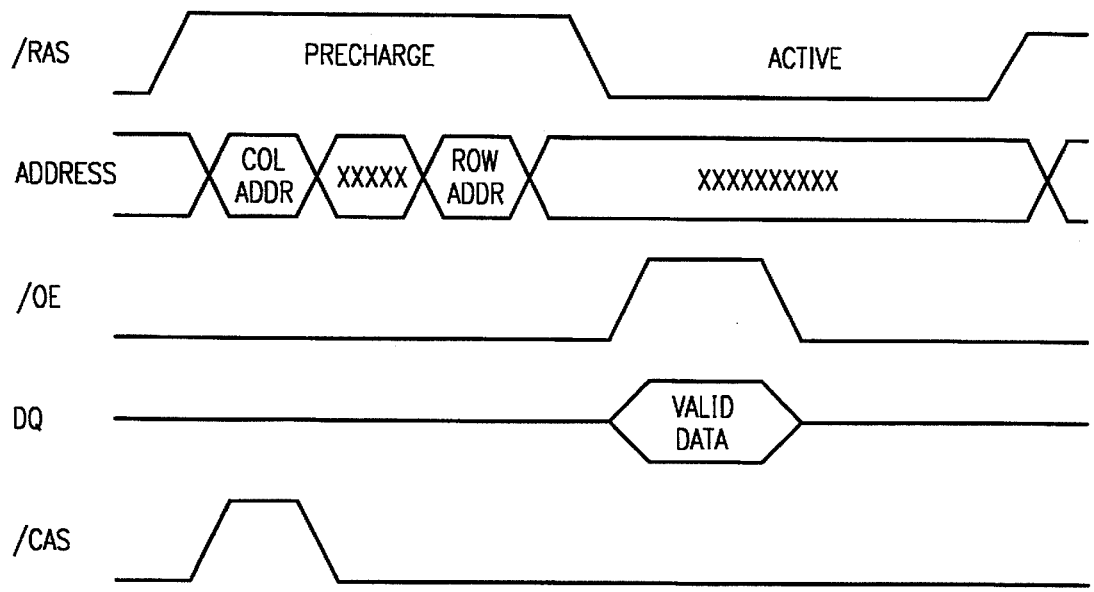
FIG. 4 is a timing diagram depicting the timing relationship between selected signals controlling a preferred method of operating the memory device of FIG. 2.

The preferred operation of memory subsystem 200 according to the principles of the present invention can now be described with reference to FIG. 4. Specifically, FIG. 4 shows one complete/RAS cycle, including the corresponding precharge cycle and active cycle. It should be noted that while the precharge/active cycle timing is shown with regards to a RAS signal, the present invention is not limited to timing by a conventional/RAS signal. For example, this timing may alternatively be based on the master clock, if memory 200 is a synchronous DRAM.

According to the principles of the present invention, the time between rising edges of/RAS may be on the order of 3 (three) nanoseconds, which is substantially less than the 140–160 nanosecond/RAS cycles of conventional DRAMs. It should be noted that FIG. 4 shows a "multiplexed" system in which row and column addresses are word-serially input from a multiplexed address bus through address port ADD0–ADDY. The principles of the present invention are equally applicable to "non-mixed" systems where the row and column address bits are simultaneously received at the address port. (In FIG. 4, the reference "xxx . . . x" indicates a high impedance/don't care state).

With the rising edge of/RAS, memory subsystem 200 enters the precharge cycle. Shortly thereafter, a column address is received at the addressed pins ADD0–ADDY. This is in contrast to conventional systems where the row address bits are typically received and input before the column address bits in a multiplexed system (during active period). These column address bits may be latched into circuitry to 10 with/CAS, although this is not a requirement of the present invention. In the preferred embodiment the column address bits include a predetermined number of bits for implementing three functions: bank select, precharge bitline group select and location (word) select. The number of each type of column address bits will vary from embodiment to embodiment depending on such factors as the number of banks 201, the number of groups of bitlines precharged per precharge cycle and the number of cells per addressed location (page). In the illustrated embodiment, where four banks 201 are provided, the bitlines 301 are organized as 4 precharge groups of 256 and each access is assumed to be to a 16-bit location, two bank select, two precharge bitline group select and four location (word) select bits compose the received column address bits.

The precharge bitline group select bits are decoded by precharged decode circuitry 206 and used to precharge a corresponding group of bitlines in the subarrays 202 of selected bank 201. For example, the precharge select bits could direct precharge circuitry 204A of Bank 0 to precharge the group of bitlines 301 consisting of half-bitlines BL0–BL255 and corresponding complementary half-bitlines BL0–BL255. All the remaining bitlines in memory subsystem 200, including the non-selected bitlines (BL256–BL1023) in the selected bank (Bank 0), as well as all the bitlines in each of the non-selected banks (in this example, Banks 1–3) are floating. Thus, in the present four-bank example, only the capacitance of 256 bitlines are being charged rather than the capacitance of all 4096 bitlines of all the subarrays 202 of all the banks 201, as would be done during precharge in a conventional DRAM.

The bank select bits perform a conventional bank select function. Generally, internal clocks, data and control signals are sequentially delivered only to the selected bank 201. The remaining banks remain in standby.

The location (word) select bits perform a traditional column selection through the column decoder circuitry 203 of the selected bank 201 during the active cycle. For example, assume again for discussion purposes that the 256 bitlines BL0–BL255 of Bank 0 have been selected for precharge and consequently precharged. Then, once a row is selected, the corresponding cells 256 will be made available for access through column decoder/sense amplifiers 203 of Bank 0. In the present example, the 4 location select bits select one 16-bit location out of the 16 possible locations of the precharged 256 bitline group.

After a short delay for setup, the row address bits received at the address pins ADD0–ADDY and latched in. Each row address selects one subwordline 301 for the selected row of the selected Bank 201 which corresponds to the precharged group of bitlines 301. In the illustrated embodiment of FIGS. 2 and 3, where each bank includes a 1024 rows with four subwordlines 300 per row (i.e. for a total of 4096 subwordlines 300), 12 row address bits that are required to perform a 1 out of 4096 select.

The use of multiple subwordlines per row provides substantial advantages particularly when used in combination with the precharge feature of the present invention. Specifically, the use of subwordlines eliminates potential disturb problems in the cells of nonselected (nonprecharged) bitlines on the selected row when the active cycle begins. For example, assume that conventional wordlines are employed which control all the cells along all the intersecting half-bitlines of a given subarray. For discussion purposes, assume that conventional bitline WL0 is selected in response to the received row address bits. Further, assume that bitlines BL0–BL255 have been selectively precharged in response to the received column address bits that the remaining bitlines BL256–WL1023 of subarray 202 of Bank 0 are allowed to float. In this case, access to bitlines BL0–BL255 would be performed without difficulty when WLO is turn-on with the falling edge of/RAS. However, the conventional wordline WL0 would also turn on the cells at the intersections of non-selected bitlines BL256–BL1023. Since these bitlines are floating, when the corresponding cells turn on, the data on the cell storage capacitors may be disturbed or destroyed, depending on the voltage stored on a given capacitor and the voltage to which the corresponding bitline has floated. The actual voltage on the floating bitlines may generally be close to zero, although it will vary depending on the migration of charge carriers in the chip substrate. Subwordlines eliminate disturb problems by insuring that the memory cells of the non-selected (non-precharged) bitlines along the selected row are not selected (remain turned-off) and their storage capacitors isolated.

On the falling edge of/RAS, memory subsystem 200 enters the active cycle, the selected subwordline is turned-on, and the addressed cells of selected bank 201 are made available for access. During the active cycle, additional location column address bits may be provided to the corresponding column decoder 203 to implement page mode access. These additional location column address bits may be generated externally and latched in with a clock, such as/CAS, or may be internally generated by using a counter or the like within control circuitry 210. Assuming again that 256 bitlines are selectively precharged during each precharge cycle and that each subwordline 300 controls a partial (fractional) row of 256 corresponding cells, then for a by-16 device, then 16 16-bit pages (locations) can be accessed per/RAS cycle.

Figure 5:
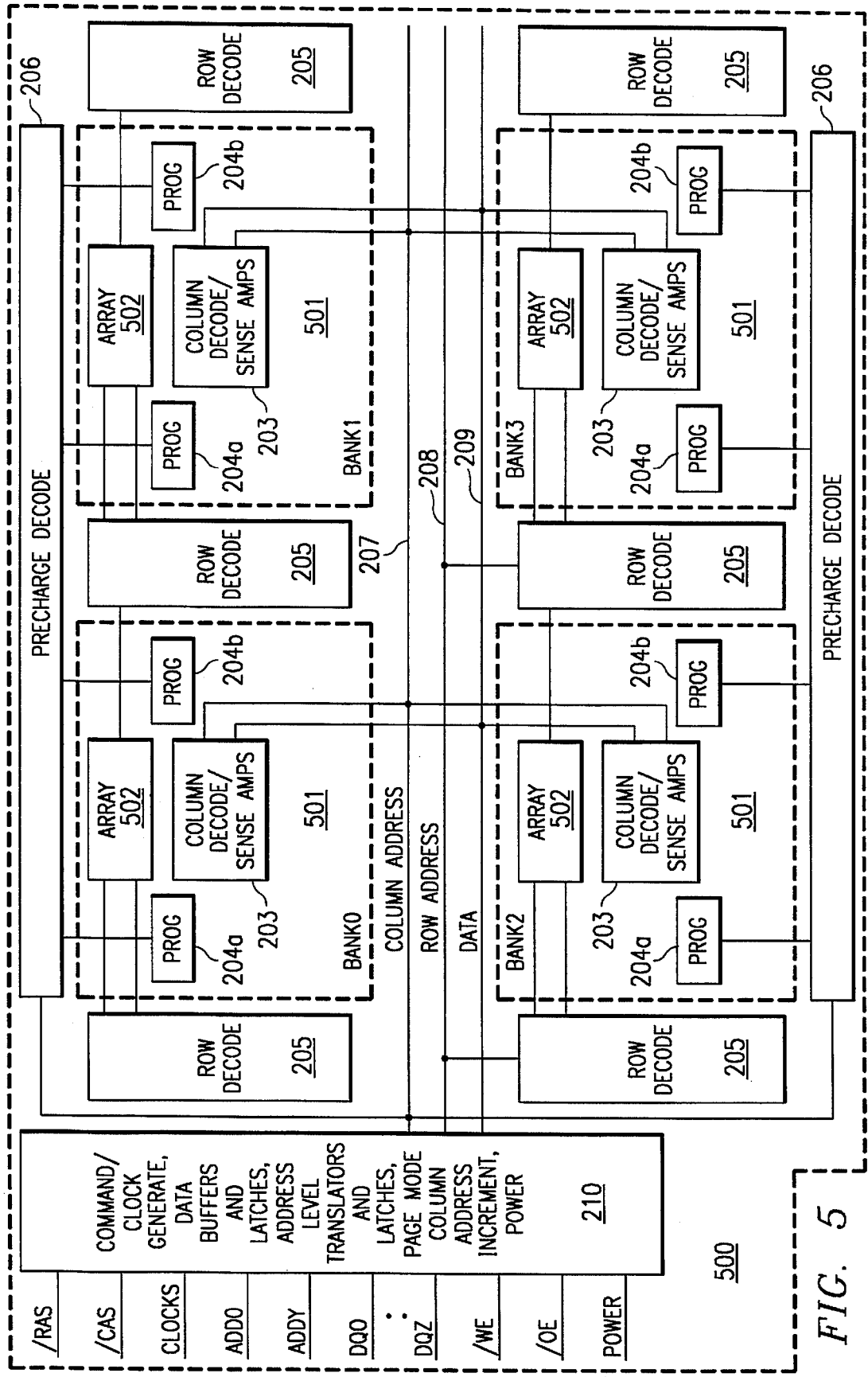
FIG. 5 is a second memory device embodying the principles of the present invention.

FIG. 5 is a second memory subsystem, subsystem 500, embodying the principles of the present invention. Subsystem 500 includes all the major structures and functions of memory subsystem 200, except that each bank includes a single array 502 of DRAM cells. Preferably, each array 502 employs folded-bitlines in contrast to the open bitlines of each subarray 202 of memory subsystem 200.

FIG. 6A is a functional block diagram of one possible embodiment of the folded-bitline array 502 of subsystem 500. For discussion purposes, it will be assumed that each array 502 is organized as 1024 rows and 1024 columns. Each row in the embodiment of FIG. 6A is controlled by four subwordlines 601, each of which controls the cells of 256 corresponding half-bitlines 602. One sense amplifier is coupled between each corresponding pair of half-bitlines $BLx$-$\overline{BL}_x$. In the illustrated embodiment, the subwordlines 601 controlling the even numbered rows, starting with Row 0, are controlled by row decoder 205a while the subwordlines 601 of the odd numbered rows, starting with Row 1, are controlled by row decoder 205b. Further, the even numbered rows include the cells coupled to the (true) half-bitlines BLx and the odd numbered rows include the cells coupled to the complementary bitlines $\overline{BL}_x$. Thus, for example, Row 0 is controlled by subwordlines WL0A–WL0D, with subwordline WL0A controlling the cells of the first 256 bitlines BL0–BL255, subwordline WL0B controls the cells of row 0 and the second 256 true half-bitlines BL256–BL511, and so forth. Similarly, subwordline WL1A controls the cells of the first 256 complementary half-bitlines $\overline{BL0}$–$\overline{BL255}$, subwordline WL1B controls the second group of 256 cells of row 1, which are coupled to complementary bitlines $\overline{BL256}$–$\overline{BL511}$, and so forth. This pattern repeats itself, with the last row of cells (row 1023) controlled by the set of wordlines labelled WL1023A–WL1024D.

FIG. 6B is an alternate embodiment of cell arrays 502 of memory system 500. Again, an array of 1024 rows and 1024 columns has been chosen for discussion purposes. Also, as was assumed above, each row of cells is controlled by four subwordlines 601. Similar to the embodiment of FIG. 6A, the cells coupled to the true bitlines controlled by subwordlines 501 and row decoder 205a while the cells coupled to complementary bitlines $\overline{BL}_x$ are controlled by wordlines and row decoder 205b. In the embodiment FIG. 6B however, the column decoder/sense amplifier circuitry 203 is partitioned into two blocks 203A and 203B. Column decoder/sense amplifier circuitry 203A controls the access to cells along the even bitlines, beginning with the bitline consisting of half-bitline pair BL0/$\overline{BL0}$. Column decoder/sense amplifier circuitry 203B controls the access to the odd bitlines, beginning with half-bitline pair BL1/$\overline{BL1}$ (not shown).

Figure 7:
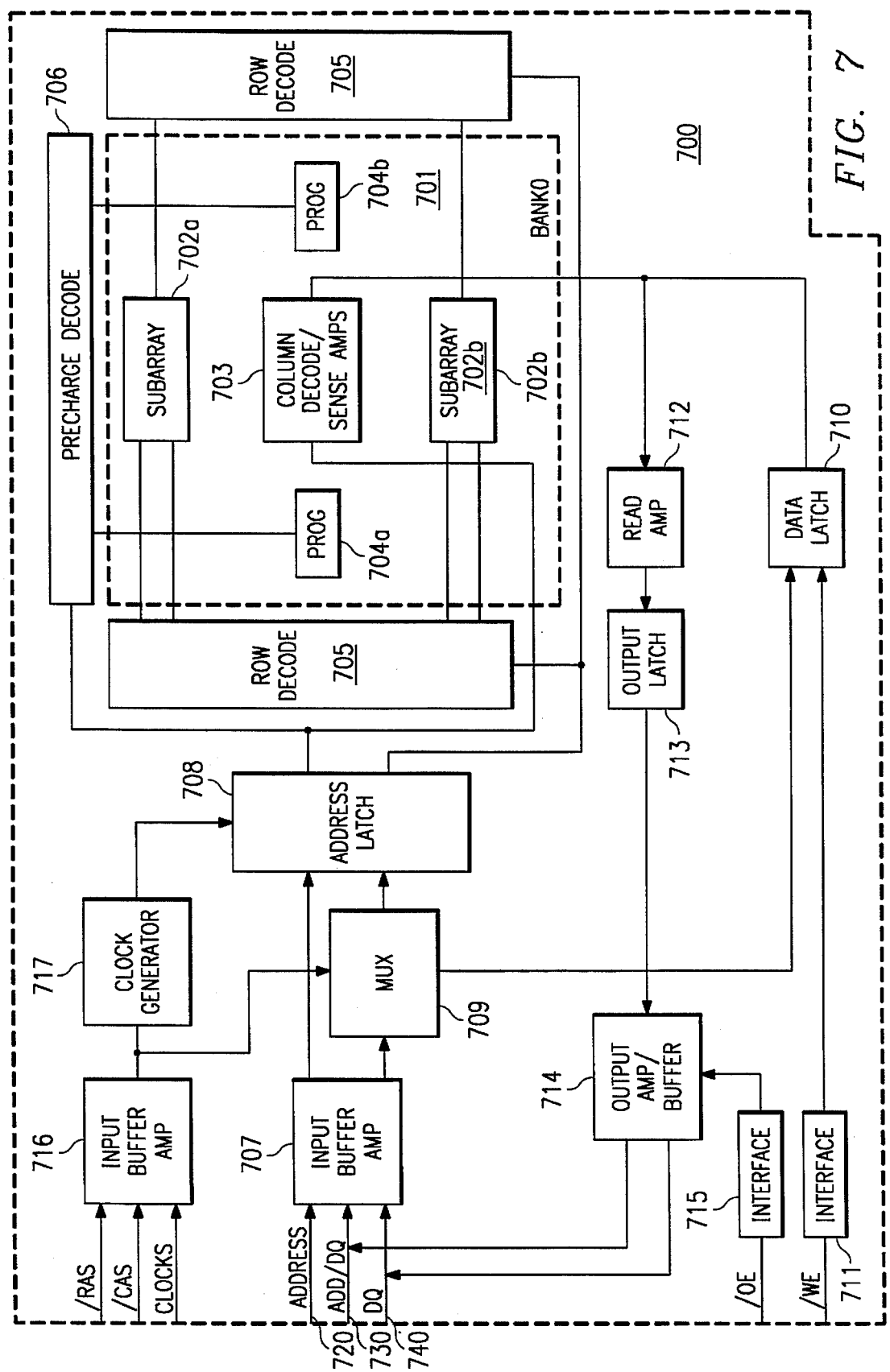
FIG. 7 is a third exemplary memory device embodying the principles of the present invention.

FIG. 7 shows one possible embodiment of the principles of the present invention in a low-pin count (multiplexed address/data port) memory system 700. A complete description of a basic low pin count memory device is found co-pending and co-assigned U.S. patent application Ser. No. 08/521,867, entitled LOW PIN COUNT - WIDE MEMORY DEVICES AND SYSTEMS AND METHODS USING THE SAME, attorney docket no. 2836-P036US, filed Aug. 31, 1995 and incorporated herein by reference. A description of the principles of the present embodiment as specifically applied to a low-pin count DRAM is as follows.

In the preferred embodiment, memory 700 is based around at least one DRAM cell bank 701. Bank 701 is similar to Banks 201 shown in the open bitline approach of FIG. 2, although the folded bitline approach of banks 501 of FIG. 5 may also be used. As with banks 201/501, each bank 701 includes one or more subarrays 702, such as those described above in conjunction with FIGS. 3 and 6, column decoder/sense amplifier circuitry 703, precharge circuitry 704, row decoder circuitry 705, and precharge decode circuitry 706. The operation of each of these circuit blocks is essentially the same as described above for blocks 201–206 and thus for brevity and clarity, the description of the operation of bank 701 will not be repeated here. It should be noted that while a single bank 701 is shown, multiple banks may be used in alternate embodiments, with bank select bits input as "column address" bits as described above.

In the low pint count embodiment of FIG. 7, memory 700 includes a selected number of I/O pins 720 which are dedicated for receiving addresses, a second selected number of pins 730 which are multiplexed for either inputting addresses or inputting and outputting data, and a third selected number of pins 740 dedicated for inputting and outputting data. The process of inputting and outputting data and addresses will be further discussed below. However, it should be noted at this point that addresses and data are selectively presented to the multiplexed pins 730 under control of core (glue) logic, such as core logic 103 of system 100. Generally, conventional core logic chips can bridge address and data buses and switch a given port in the system, such as multiplexed pins 730, to either the address path or the data path of either CPU bus 102 or PCI local bus 116. It should be noted that the "frame buffer" can also use the address/data multiplexing scheme, provided the memory controller embedded in the graphics controller is designed suitably to perform such switching.

While in the illustrated embodiment only some of the address pins are multiplexed, and some are dedicated, in alternative embodiments all the pins receiving addresses may be multiplexed to also receive data. The same is true for those pins dedicated for receiving data; in alternate embodiments all pins exchanging data may be multiplexed to also receive addresses. In the preferred embodiment, some address pins are dedicated in order to be available to be used for other functions. For example, the pins receiving the high order address bits may be non-multiplexed and also used for bank or byte select operations.

I/O pins 720, 730, 740 are coupled to an input buffer/amplifier 707. Addresses received on a dedicated address pins 720 are coupled to an address latch 708. Addresses received on multiplexed pins 730 are selectively passed to address latch 708 through a multiplexer 709. It should be noted that row and column addresses received at pins 720 and 730 may be word serially received (i.e., row address bits received as a word and column address bits received subsequently as a separate word) from a conventional multiplexed address bus. In this case, address latch 708 may be a conventional 3-phased address latch system which would pipeline the initially received row addresses to row decoder 705 and the subsequently received column addresses no column decoder 703.

During data input (a write operation), data received on multiplexed pins 730 and dedicated data pins 740 are switched by multiplexer 206 to a data latch 710. During a write, data latch 710 transfers the data being written to column decoder 703 in response to a write enable (WE) control signal received by TTL, CMOS or other I/O standard, interface circuit 711.

During a data read, data output from sense amplifiers/column decoder circuitry 703 are passed first to a read amplifier 712 and then to an output latch 713. The data from output latch 713 is then passed through an output amplifier/buffer 714 to multiplexed pins 730 and data pins 740, preferably bypassing input buffer/amplifier 707. Output amplifier/buffer is enabled by an output enable signal (/OE) received by TTL, CMOS or other I/O standard, interface circuitry 715.

The timing and control in the illustrated embodiment of FIG. 7 is based on a row address strobe (/RAS), column address strobe (/CAS) and conventional DRAM control clocks received through an amplifier/buffer 716. In the preferred asynchronous embodiment, /RAS is used to control (switch) multiplexer 709 as discussed below. Alternatively, multiplexer 709 may be controlled by both the/RAS and/CAS signals. A clock generator 717 generates the clocks necessary to pipeline addresses through address latch 708 from the received/RAS, /CAS and clock signals.

Figure 8:
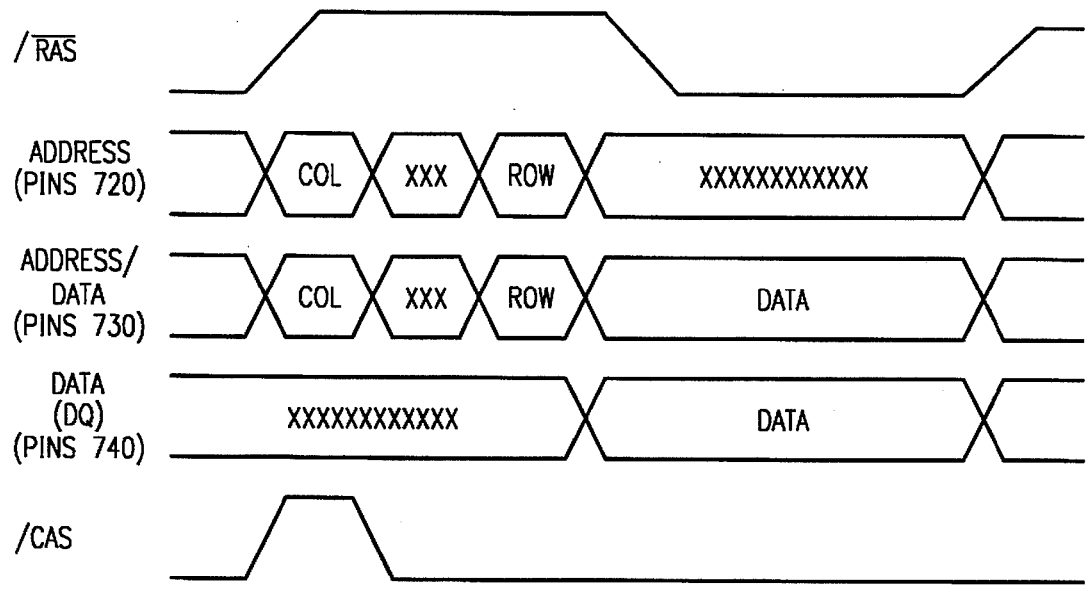
FIG. 8 is a timing diagram depicting the timing relationship between selected signals in a preferred method of operating the memory device of FIG. 5.

FIG. 8 is a timing diagram illustrating the preferred operation of memory 700. During the period when/RAS is high, memory 700 is in precharge. Again, generally, during precharge, various nodes of the dynamic circuitry, of which memory device 200 is preferably constructed, are brought to selected voltages, and most importantly, the selective precharge of a group of bitlines in subarrays 702 is performed as discussed above. Also as discussed above, addresses are received during this period when/RAS is inactive (high). In this case addresses are input on both the address dedicated pins 720 and the multiplexed address/data pins 730. Consequently, during/RAS high, MUX 709 switches to couple multiplexed pins 730 to address latch 708. In the preferred embodiment, column address bits (including any bank select bits, the precharge bitline group select bits and the location select bits) are first received and passed to address latch 708 for pipelining to row decoder 705 and precharge decode 706. After a don't care period, the row address bits presented on pins 730 and 740 are received and pipelined through address latch 708 to row decoders 705. In a non-multiplexed addressing system, row and column bits would be received at once. Selective precharging of a given group of bitline is performed as described above under control of the precharge group select bits received as part of the column address. (The label "xx . . . x" indicates a high impedance/don't care state).

On the falling edge of/RAS, memory 700 enters an active cycle and the subwordline for the selected partial row activated (pulled-high). During a write, multiplexer 709 switches such that data received at both the multiplexed input pins 730 and the data dedicated pins 705 are coupled to data latch 708 for presentation to column decoder 703, as controlled by the write enable signal. During a read, multiplexer 709 is in a don't care or tri-state (high impedance) condition. The data is then read out through the path comprising sense amps/column decoder 703, read amplifier 712, output latch 713 and output amplifier/buffer 714. With the rising edge of/RAS, memory 700 leaves the active state, enters the next precharge cycle and waits for a new set of row and column addresses.

In the preferred embodiment, the input of row and column addresses, even from a multiplexed bus, is performed independent of a column address strobe (/CAS). In alternative embodiments, /CAS may be used to control the timing and latching in to address latch 708 of the column addresses appearing on address pins 720 and multiplexed pins 730 during each inactive cycle. The timing relationship of /CAS with the /RAS, addresses and data is also shown in FIG. 8.

The scheme also works equally well, as an alternate embodiment, in a synchronous mode with master clock or in a traditional DRAM timing scheme wherein the row address is strobe on the falling edge as /RAS and the column address is strobe on the falling edge of /CAS.

Figure 9:
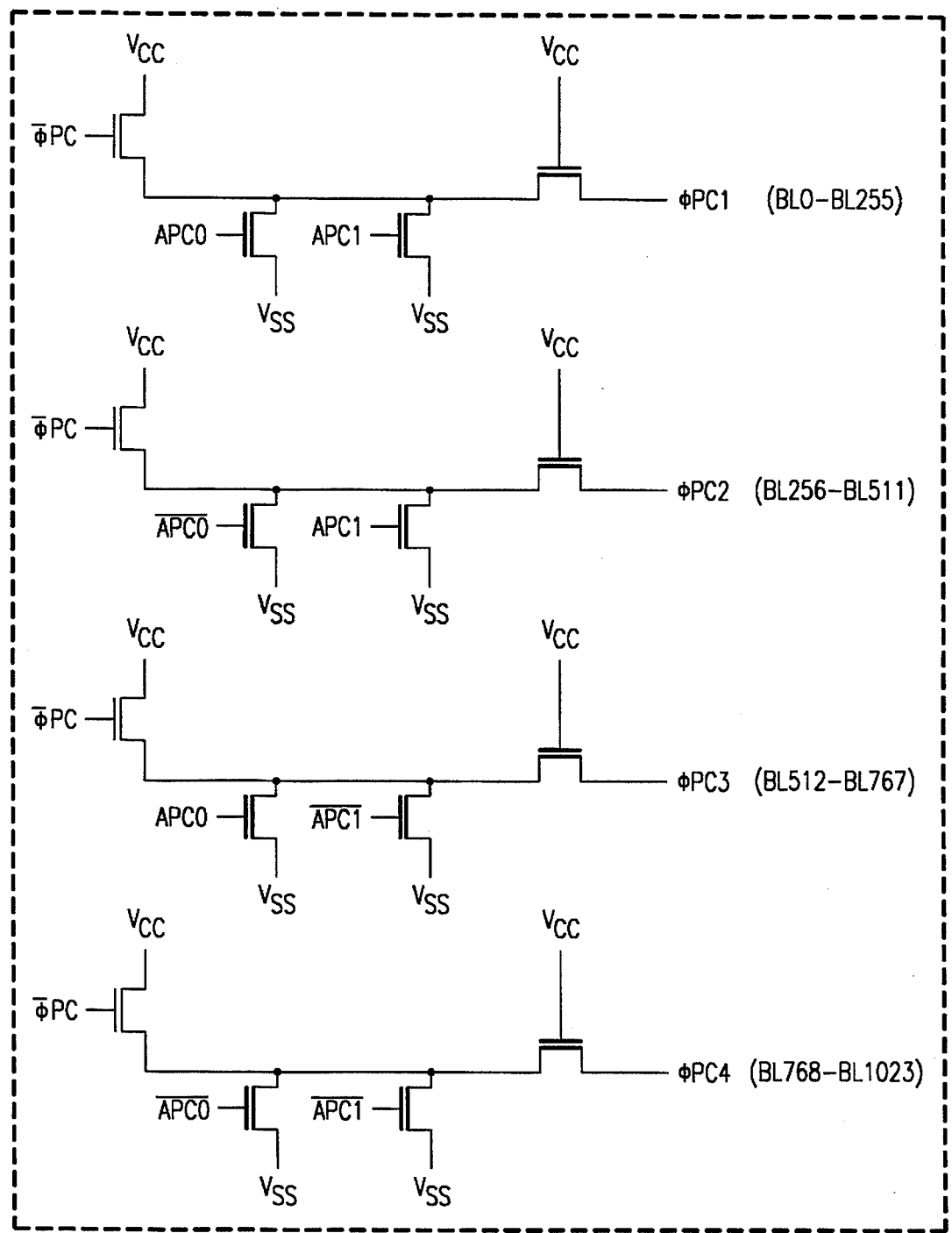
FIG. 9 is an electrical schematic diagram depicting a preferred embodiment of the pre-charge decode circuitry shown in FIGS. 2, 5, and 7.

FIG. 9 is a transistor level electrical schematic diagram illustrating one possible embodiment of precharge decode circuitry 106. Consistent with the illustrated embodiment, four precharge enable clocks ($\Phi_{pc1}$–$\Phi_{pc4}$) are generated in order to select one out of the four groups of 256 bitlines of the cell array 202/502 of the active bank 201/501. In order to implement the one out of four select, the two precharge bitline group select bits $A_{pc0}$ and $A_{pc1}$ and their complements $\overline{A_{pc0}}$ and $\overline{A_{pc1}}$ are decoded. As discussed above, these bits are preferably input as part of the column address bits. The input signal $\overline{\Phi_{pc}}$ is the convention precharge enable clock.

Figure 10:
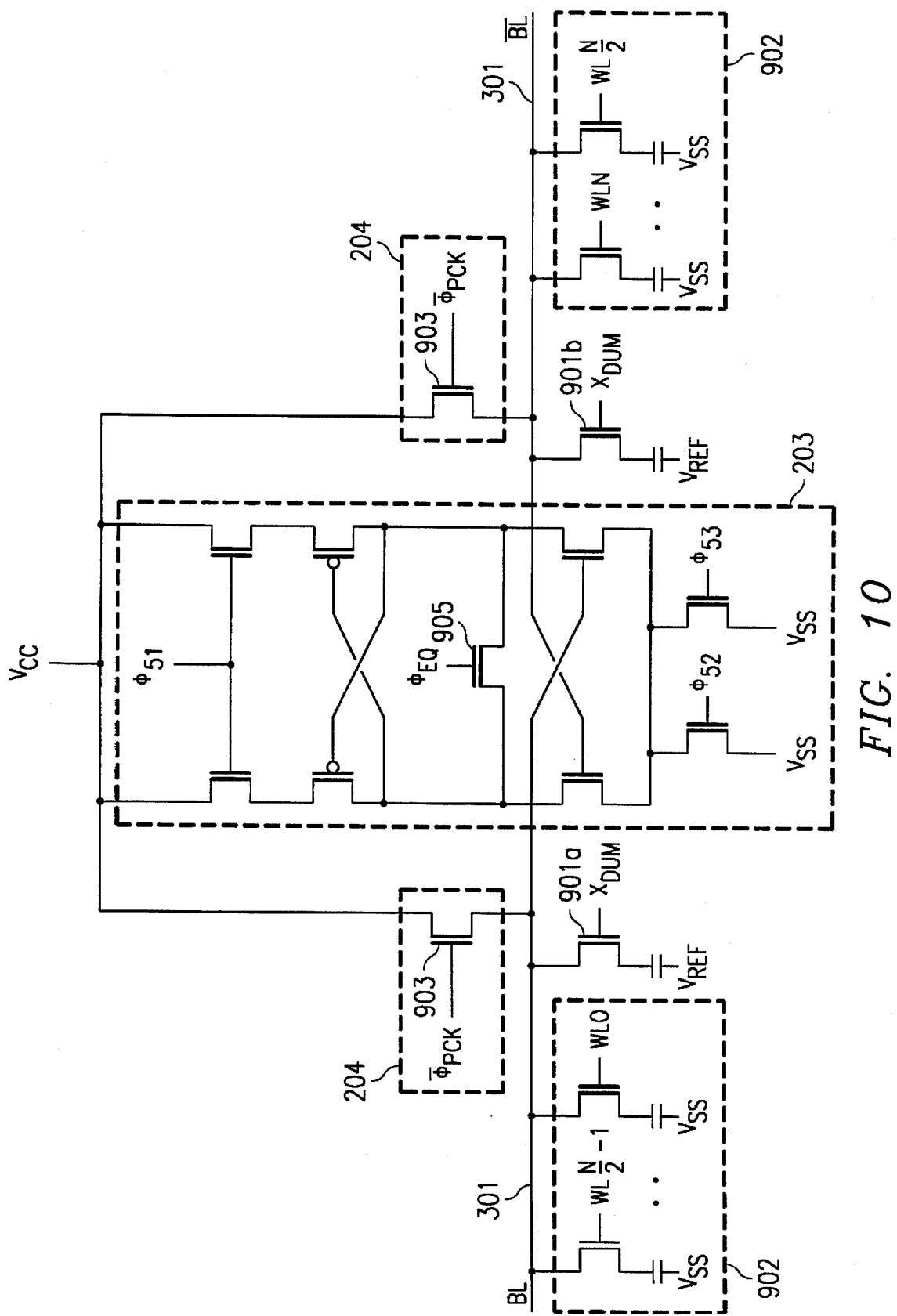
FIG. 10 is a electrical schematic diagram depicting a typical organization and interconnection of a pair of half-bitlines and their associated cells, the associated sense amplifier, and the corresponding precharging circuitry.

FIG. 10 is a transistor level electrical schematic diagram depicting the preferred scheme for interfacing precharge decode circuitry 206 and precharge circuitry 204 for a given half-bitline pair. In FIG. 10, an open bitline configuration, such as shown in FIG. 3, is assumed for discussion purposes. The interconnection will essentially be the same for the folded bitline approach, such as those shown in FIGS. 6A and 6B.

In FIG. 10, a half-bitline pair 301 is shown coupled to the corresponding sense amplifier of sense amplifier/column decode circuitry 203. The timing of sense amplifier 203 is timed by the conventional sense clocks $\Phi_{S1}$, $\Phi_{S2}$, and $\Phi_{S3}$. Each bitline 301 is shown coupled to corresponding conventional dummy cell 901a or 901b along with the corresponding data storage cells 902. In FIG. 9, the corresponding subwordlines 300 are labeled WL0–WLN.

In the preferred embodiment, each block of precharged circuitry 204A/204B consists of an array of transistors 903, each of which controls the charging of a corresponding half-bitline 301 from the high voltage rail Vcc. There may be one precharge transistor per half-bitline or alternatively one large transistor for pulling up all the half-bitlines of each precharge bitline group. The precharge transistors 903 of the selected bank 201 are turned on and off in response to the precharge enable clock $\Phi_{px}$, where $\Phi_{px}$ is the corresponding one of the signals generated shown in FIG. 9 for the associated bitline group.

An equalization device 905 is also provided controlled by a clock $\Phi_{EQ}$. For the group of bitlines 301 being precharged, $\Phi_{EQ}$ turns transistor 905 just before those bitlines are allowed to float. This allows each half-bitline BL and the complementary half-bitlines/BL pair of the group to be voltage equalized as closely as possible.

For a complete description of precharging in sensing in DRAMs, reference is now made to the following papers which are hereby incorporated herein by reference: "*High Speed Sensing Scheme for CMOS DRAMs*", Dhong, et al., IEEE journal of Solid State Circuits, Vol. 23, No. 1, February, 1988; "*50-ns 16-Mb DRAM with a 10-ns Data rate and On-chip ECC*", Kalter, et al., IEEE journal of Solid State Circuits, Vol. 25, No. 5, October, 1990; and "*A Variable Precharge Voltage Sensing*", Kirihata, et al., IEEE Journal of Solid State Circuits, Vol. 30, No. 1, January, 1995.

Although the present invention and its advantages have been described in detail, it should be understood that various changes, substitutions and alterations can be made herein without departing from the spirit and scope of the invention as defined by the appended claims.

What is claimed is:

1. A memory comprising:
   an array of a plurality of columns of memory cells, said plurality of columns being associated with N number of bitlines organized as N/B number of groups of B number of bitlines per group, each of a set of N/B number of subwordlines controlling cells coupled to a corresponding said group of bitlines, N and B being integers greater than zero and not approaching infinity; and
   precharge circuitry for precharging a selected said group of bitlines.

2. The memory of claim 1 wherein said precharge circuitry is further operable to allow remaining ones of said bitlines to float.

3. The memory of claim 1 wherein each bitline comprises a pair of half-bitlines arranged in an open-bitline fashion.

4. The memory of claim 1 wherein each bitline comprises a pair of half-bitlines arranged in a folded-bitline fashion.

5. The memory of claim 1 wherein said array comprises N number of bitlines comprising N/B number of groups of B number of bitlines each, and wherein each of said rows is associated with N/B number of subwordlines each controlling ones of said cells coupled to a corresponding one of said group of bitlines, N and B being integers greater than zero.

6. The memory of claim 1 wherein said memory cells comprise dynamic random access memory cells.

7. The memory of claim 2 and further comprising row decoder circuitry coupled to said subwordlines, said row decoder circuitry activating a selected one of said wordlines corresponding to a precharged group of said bitlines.

8. The memory of claim 1 and further comprising column decoder circuitry for controlling access to said bitlines.

9. A memory comprising:
   an array of memory cells arranged in columns, each column associated with a bitline, access to selected cells of said array controlled with a plurality of sets of subwordlines, wherein each subwordline of each set controls ones of said cells coupled to a corresponding group of said bitlines;
   precharge circuitry for precharging a selected said group of bitlines; and
   addressing circuitry for selecting a said subwordline controlling said cells coupled to said selected group of bitlines.

10. The memory of claim 9 wherein said addressing circuitry comprises first row decoder circuitry for controlling selection of said subwordlines of a first set of said rows and second row decoder circuitry for controlling selection of said subwordlines of a second set of said rows.

11. The memory of claim 9 wherein said addressing circuitry selects a subwordline in response to a row address.

12. The memory of claim 11 wherein said row address is received during a precharge cycle.

13. The memory of claim 9 wherein said precharge circuitry comprises precharge decode circuitry for selecting a group of bitlines for precharging and circuitry under the control of said precharge decode circuitry for pulling a selected group of bitlines to a precharge voltage.

14. The memory of claim 9 wherein said precharge circuitry precharges a selected group of bitlines to a positive voltage.

15. The memory of claim 9 wherein said precharging circuitry selects a group of bitlines for precharging in response to at least one address bit.

16. The memory of claim 9 and further comprising column decoder circuitry for selecting ones of said cells coupled to said selected group of bitlines to be accessed.

17. A memory subsystem comprising:

input/output circuitry for inputting and outputting data and addresses; and at least one memory bank coupled to said input/output circuitry comprising:

a plurality of columns of memory cells, each cell of a column coupled to a bitline associated with said column and a corresponding one of a plurality of subwordlines;

precharge circuitry for precharging selected bitlines to a predetermined voltage;

precharge decoder circuitry for selecting in response to precharge select bits selected bitlines for precharge by said precharge circuitry;

row decoder circuitry for activating a selected subwordline in response to a received row address to select a set of cells coupled to said selected subwordline for access; and column decoder circuitry for selecting in response to a column address selected bitlines coupled to selected cells of said set of cells to be accessed.

18. The memory subsystem of claim 17 wherein each bitline comprises a pair of complementary half-bitlines arranged in an open-bitline manner.

19. The memory subsystem of claim 17 wherein each bitline comprises a pair of complementary half-bitlines arranged as a single array in a folded-bitline manner.

20. The memory subsystem of claim 17 wherein said precharge circuitry precharges selected bitlines during a precharge cycle defined by a clocking signal.

21. The memory subsystem of claim 20 wherein said clocking signal comprises a row address strobe.

22. The memory subsystem of claim 20 wherein said input/output circuitry is operable to input received row and column addresses during said precharge cycle.

23. The memory subsystem of claim 22 wherein said precharge select bits comprises a portion of a column address.

24. The memory subsystem of claim 17 wherein said at least one bank comprises a plurality of banks, one of said banks selected for access in response to bank select bit.

25. The memory subsystem of claim 17 wherein said input/output circuitry comprises multiplexed address/data pins for receiving address bits during said precharge cycle and for exchanging data with said column decoder during an active cycle.

26. A method of operating a memory including a plurality of memory cells arranged in columns, the cells of a column coupled to a bitline associated with the column and each cell coupled to a preselected one of a plurality of subwordlines, precharge circuitry for procharging a selected group of bitlines in response to at least one precharge select bit, and addressing circuitry for activating a selected one of the subwordlines in response to an address, the method comprising the steps of:

during a precharge period, providing at least one precharge select bit for procharging a selected group of bitlines;

during the precharge period, providing a row address for selecting a subwordline for activation, the subwordline selected for activation controlling cells coupled to the group of bitlines selected for precharge;

during the precharge period, precharging the selected group of bitlines; and during an active cycle, accessing at least some of the cells coupled to a subwordline selected for activation during the precharge period.

27. The method of claim 26 and further including the step of timing the precharge period and the active cycle with a clock.

28. The method of claim 26 and further including the step of timing the precharge period and the active cycle with a row address column strobe.

29. The method of claim 26 wherein said step of providing the address comprises the step of providing the address to at least one multiplexed address/data pin.

30. The method of claim 29 wherein said step of accessing comprises the step of accessing at least one cell through the at least one multiplexed address/data pin.

31. The method of claim 26 and further comprising the step of selecting the cells for access in response to a received column address.

32. The method of claim 26 wherein a column address is received prior to receipt of a row address.

33. The method of claim 26 wherein the precharge select bit comprises a part of the column address.

34. The method of claim 31 wherein said step of selecting cells for access comprises the step of preforming a page mode access in response to a plurality of column addresses.

* * * * *